United States Patent [19]

Suzuki

[11] Patent Number: 5,409,348

[45] Date of Patent: Apr. 25, 1995

[54] SUBSTRATE TRANSFER METHOD

[75] Inventor: Fujio Suzuki, Kanagawa, Japan

[73] Assignees: Tokyo Electron Limited, Tokyo; Tokyo Electron Sagami Limited, Kanagawa, both of Japan

[21] Appl. No.: 61,290

[22] Filed: May 14, 1993

[30] Foreign Application Priority Data

May 15, 1992 [JP] Japan .................. 4-147937

[51] Int. Cl.⁶ .................. B65G 65/00; G01B 11/00
[52] U.S. Cl. .................. 414/786; 414/937; 414/416; 901/9
[58] Field of Search .............. 414/331, 404, 416, 786, 414/937, 940; 901/9, 10, 35

[56] References Cited

U.S. PATENT DOCUMENTS

| 4,550,242 | 10/1985 | Uehana et al. | 414/331 |
| 4,603,897 | 8/1986 | Foulke et al. | 901/35 X |
| 4,770,590 | 9/1989 | Hugues et al. | 414/937 X |
| 4,911,597 | 4/1990 | Maydan et al. | 414/416 X |
| 4,985,676 | 1/1991 | Karasawa . | |
| 4,986,729 | 1/1991 | Ohlenbusch | 414/404 X |
| 5,044,752 | 9/1991 | Thurfjell et al. | 414/937 X |

FOREIGN PATENT DOCUMENTS

| 465855 | 4/1992 | Japan | 414/937 X |
| 5-114641 | 5/1993 | Japan | 414/937 X |

Primary Examiner—Michael S. Huppert
Assistant Examiner—Stephen Gordon
Attorney, Agent, or Firm—Oblon, Spivak, McClelland, Maier, & Neustadt

[57] ABSTRACT

A method of transferring a substrate with a transfer unit including at least one fork having a substrate support portion, and a sensor arm having a sensor mounted thereon, for transferring the substrate between a substrate holding member and a substrate support member, includes the steps of arranging a position detecting plate on a rest portion of the substrate support member, obtaining position information of the position detecting plate by detecting the position of the position detecting plate with respect to the reference position of the transfer unit by the sensor arm, and transferring the substrate by controlling the position of the transfer unit on the basis of the position information.

14 Claims, 7 Drawing Sheets

SUBSTRATE TRANSFER METHOD

BACKGROUND OF THE INVENTION

1. Field of the Invention

The present invention relates to a method of transferring a plate-like substrate, e.g., a semiconductor wafer, between a substrate holding member and a substrate support member.

2. Description of the Related Art

For example, a semiconductor manufacturing process includes a step of subjecting a substrate to a heat treatment, e.g., a semiconductor wafer, and a heat treatment apparatus for performing batch heat treatment of a large number of substrates is recently used to achieve required heat treatment efficiently. In a heat treatment apparatus of this type, when a large number of substrates transferred from a substrate holding member, e.g., a carrier, are supported by an arbitrary substrate support member, the substrate support member is loaded in a reaction vessel. After predetermined heat treatment is performed, the substrate support member is directly removed from the reaction vessel. As the substrate support member, a wafer boat made of quartz is usually used.

Semiconductor wafers are transferred to the wafer boat by a transfer unit. The operation of the transfer unit is controlled by a control mechanism in accordance with a predetermined pattern. The operation of the transfer unit must be accurately performed for an actually installed wafer boat.

The wafer boat must be periodically cleaned as reaction products and the like attach to contaminate it during a heat treatment step and the like. It is, however, almost impossible to install a cleaned wafer boat in a state strictly the same as that of the wafer boat before cleaning. More specifically, it is very difficult to completely restore the installation position or posture of the wafer boat after the wafer boat is cleaned. A deformation or distortion is sometimes caused in the wafer boat due to cleaning and heating at a temperature of 1,000° C. or more. Furthermore, wafer boat replacement is sometimes performed. In such a case, when the transfer unit is operated in accordance with the same operation pattern as that employed before cleaning or replacement, the semiconductor wafer cannot be appropriately supported by the wafer boat, and is incompletely supported by the wafer boat. Then, the semiconductor wafer may drop, or sometimes the wafer boat may be knocked down by a semiconductor wafer which is to be supported to the wafer boat by the transfer unit.

From these situations, when a new wafer boat is installed, the operation pattern of the transfer unit must be adjusted (subjected to teaching) so that a transfer operation matching to the wafer boat is executed.

Conventionally, teaching of the transfer unit is manually performed. More specifically, when the forks of the transfer unit are inserted in the wafer boat, the operator finely adjusts the forks by visually confirming adjustment state of the vertical movement, swing movement, and forward-and-backward movement of the forks such that the positions of the forks and the support grooves of the wafer boat relative to each other become appropriate, thereby performing this teaching in accordance with visual confirmation in a trial-and-error manner.

However, since this teaching is performed by confirmation and adjustment of the positions of the forks of the transfer unit with respect to all the support grooves of the wafer boat, this requires a very large operation load and a long operation time, while it cannot always obtain high reliability.

SUMMARY OF THE INVENTION

It is an object of the present invention to provide a substrate transfer method capable of transferring a substrate with high reliability while always maintaining an appropriate positional relationship with respect to an installed substrate support member.

This object is achieved by a method of transferring a substrate with a transfer unit including at least one fork having a substrate support portion, and a sensor arm having a sensor mounted thereon, for transferring the substrate between a substrate holding member and a substrate support member, having the steps of arranging a position detecting plate on a rest portion of the substrate support member, obtaining position information of the position detecting plate by detecting a position of the position detecting plate with respect to a reference position of the transfer unit by the sensor arm, and transferring the substrate by controlling the position of the transfer unit on the basis of the position information.

According to this method, since the specific position of the position detecting plate supported by a substrate support member is detected by the sensor provided to the transfer unit, the obtained detection position information is information having high reliability as the reference of the position of a substrate which is appropriately supported by the substrate support member. Therefore, the position of the transfer unit with respect to the substrate support member can be appropriately set by controlling the position of the transfer unit on the basis of the detection position information. As a result, the substrate can be reliably transferred to the substrate support member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENT

The preferred embodiment of the present invention will be described in detail. In this embodiment, a semiconductor wafer is used as the substrate, and a wafer boat is used as the substrate support member. However, the present invention is not limited to them, and, e.g., an LCD substrate can be used as the substrate.

Figure 1:
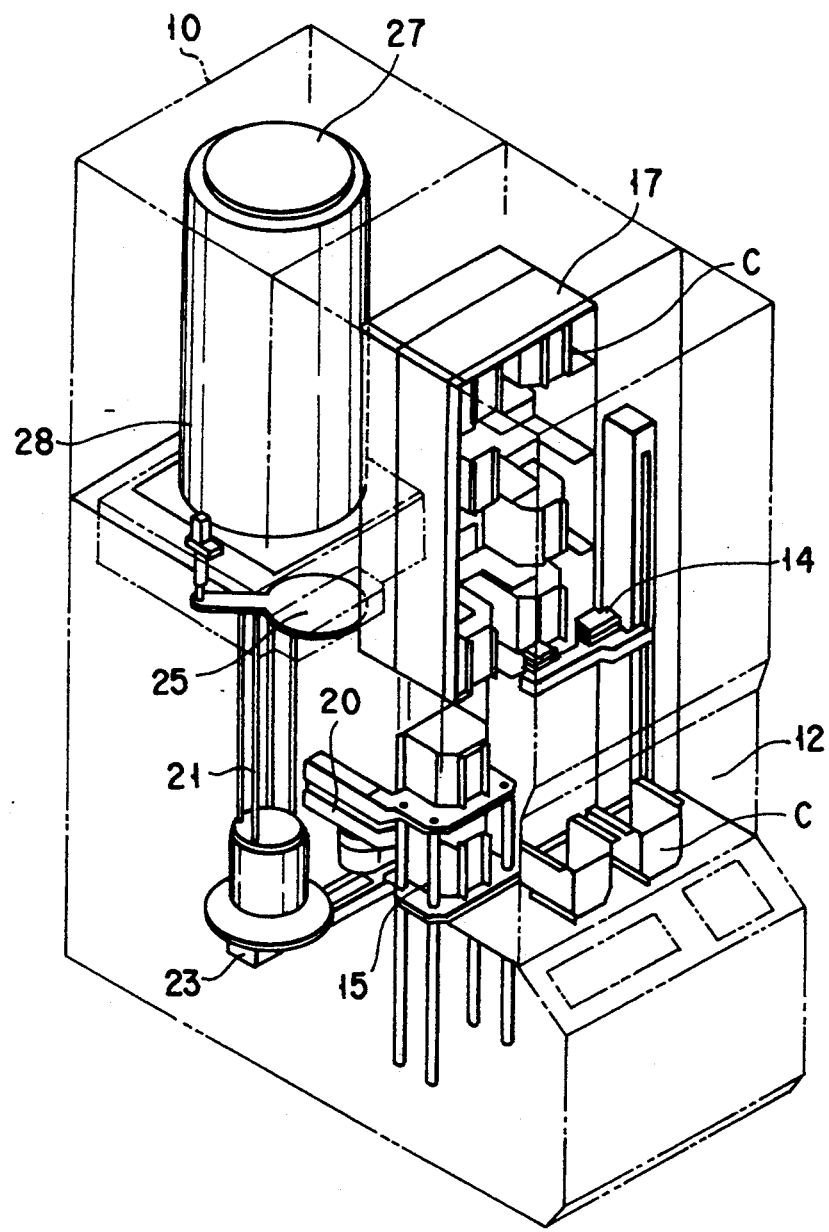
FIG. 1 is a perspective view showing an arrangement of a heat treatment apparatus to which the present invention can be applied.
Figure 2:
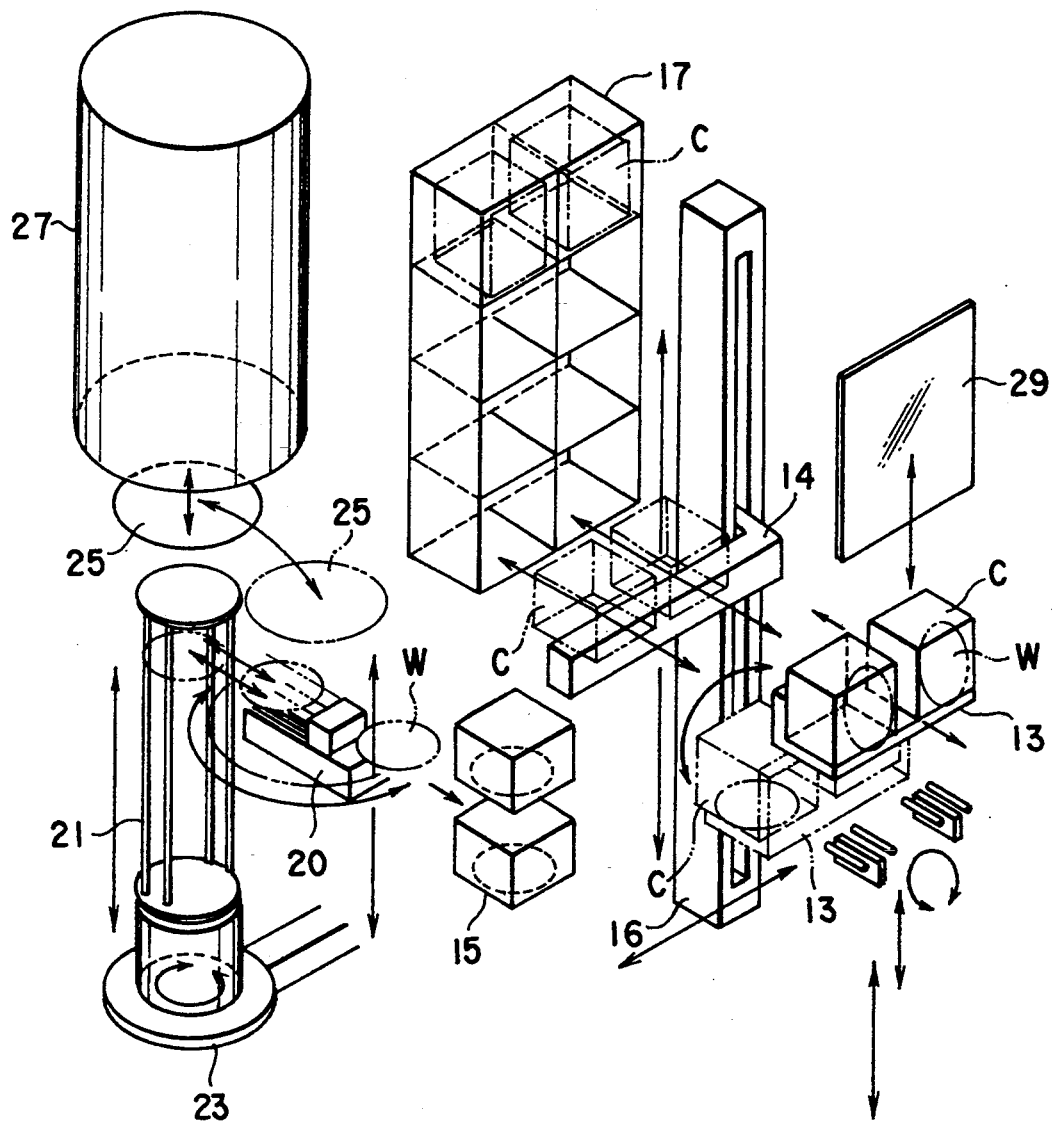
FIG. 2 is a perspective view for explaining conveyance of a semiconductor wafer in the heat treatment apparatus of FIG. 1.

FIG. 1 is a perspective view showing an arrangement of a heat treatment apparatus to which the method of the present invention can be applied, and FIG. 2 is a perspective view for explaining movement of a semiconductor wafer.

In this heat treatment apparatus 10, a carrier C housing, e.g., 25 wafers W is placed on a direction changing mechanism 13 at an outlet 12, and the direction of the carrier C is changed by 90° by the direction changing mechanism 13. Subsequently, the carrier C is loaded on a transfer stage 15 by a carrier transfer mechanism 14, or is loaded in a carrier stocker 17 by a carrier elevator 16. Then, the wafers W in the carrier C on the transfer stage 15 are transferred to a wafer boat 21 by a transfer unit 20.

The wafer boat 21 supporting the predetermined number of wafers W is moved upward by a wafer boat elevator 23, and is inserted in a reaction vessel 27 from its lower end which is opened by opening its cap 25. Then, the cap 25 is closed, and the wafers W are subjected to a heat treatment in the reaction vessel 27 by a heater 28. Referring to FIG. 2, reference numeral 29 denotes an auto door for opening/closing the outlet 12.

Figure 3:
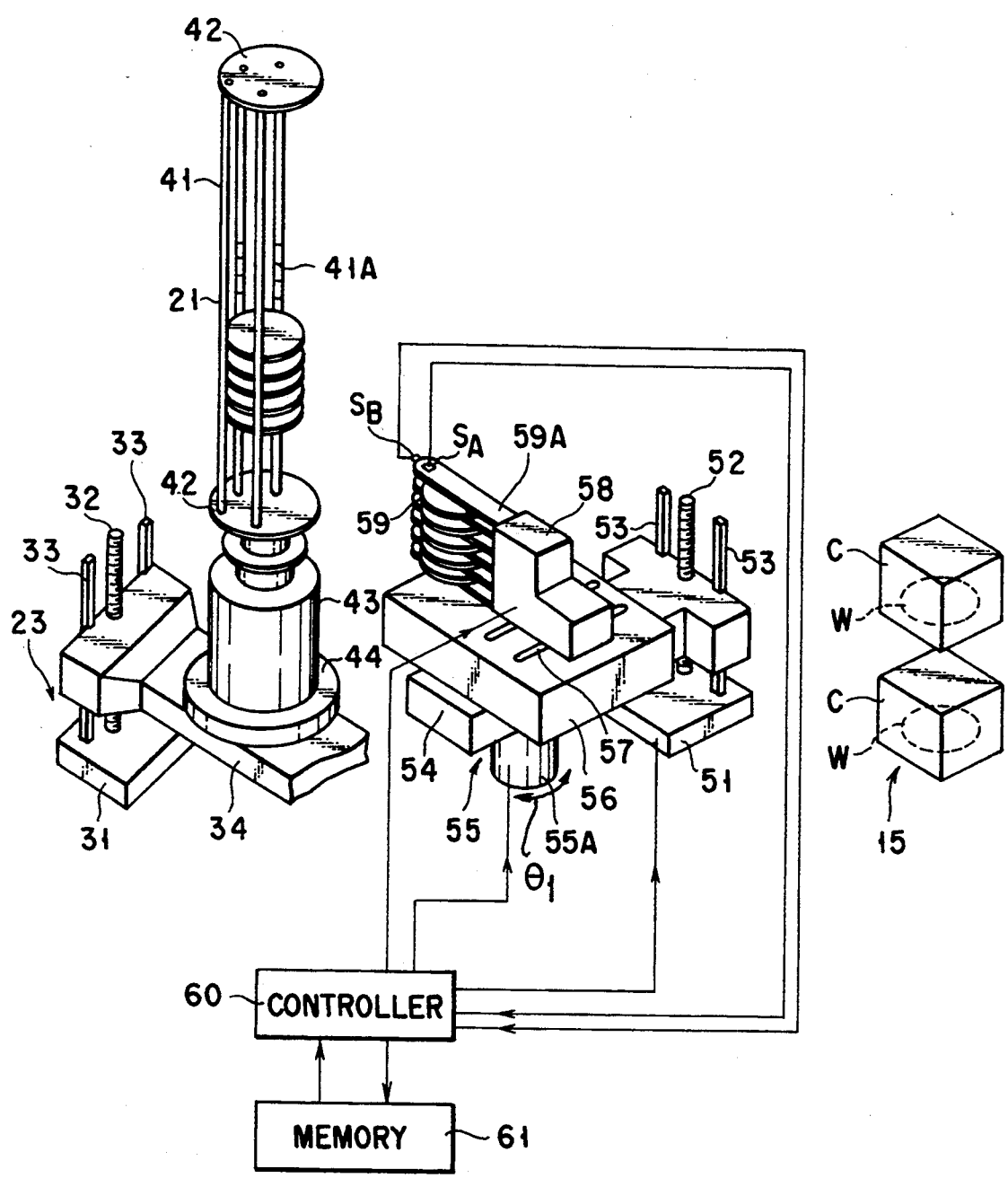
FIG. 3 is a perspective view for explaining a transfer unit that operates in accordance with a method of the present invention.

The wafer boat elevator 23 has an arrangement as shown in FIG. 3. More specifically, a ball screw 32 is engaged with a driver 31, and two linear guides 33 extend upward in the vertical direction. A rest table 34 is engaged with the ball screw 32. The rest table 34 is vertically moved by rotating the ball screw 32 with the driver 31. By this vertical movement of the rest table 34, the wafer boat 21 housing the substrates can be loaded in the reaction vessel 27 and unloaded from the reaction vessel 27 after the heat treatment.

Figure 4:
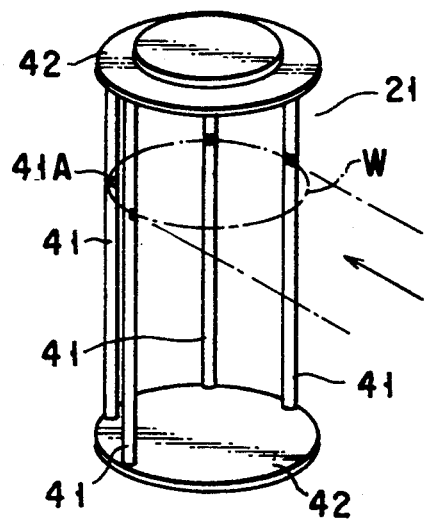
FIG. 4 is a perspective view showing a wafer boat.
Figure 5:
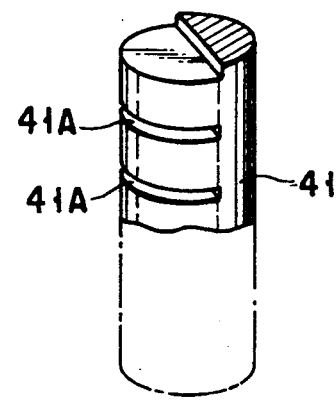
FIG. 5 is a perspective view showing one pole of the wafer boat.

As shown in FIG. 4, the wafer boat 21 is made of a material, e.g., quartz, having excellent heat resistance and corrosion resistance. The wafer boat 21 has four poles 41 having 100 to 150 grooves 41A, a pair of disks 42 for fixing the upper and lower end portions of the four poles 41, a heat-insulating cylinder 43 mounted under the lower disk 42, and a flange 44 provided on the lower end of the heat-insulating cylinder 43. As shown in FIG. 5, the grooves 41A are formed at a predetermined pitch to be spaced apart from each other in the longitudinal direction of the poles 41. The opening width of each groove 41A is, e.g., 3.5 mm when the wafer is a 0.725-mm thick and 8-inch diameter wafer, and 3.0 mm when the wafer is a 0.65-mm thick and 6-inch diameter wafer. The grooves 41A are equidistantly formed in each pole 41 in the vertical direction. This distance is set such that the forks of the transfer unit 20 to be described later can be inserted between substrates without abutting against the substrates.

When the wafer boat 21 is loaded in the reaction vessel 27, its flange 44 is brought into contact with the flange of a manifold, thereby sealing the interior of the reaction vessel 27.

Figure 6A:
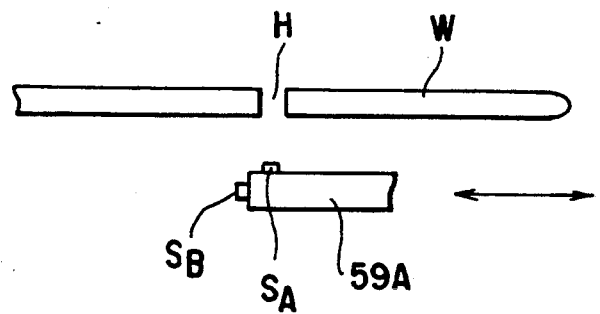
FIG. 6A is a diagram showing the relationship between a first sensor $S_A$ and a wafer W.
Figure 6B:
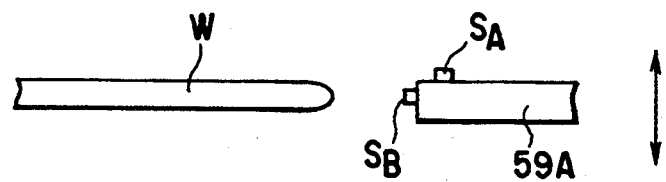
FIG. 6B is a diagram showing the relationship between a second sensor $S_B$ and the wafer W.

The transfer unit 20 disposed near the wafer boat elevator 23 has an arrangement as shown in FIG. 3. More specifically, a ball screw 52 is engaged with a pulse motor 51, and two linear guides 53 extend upward in the vertical direction. A first rest table 54 is engaged with the ball screw 52. The first rest table 54 is vertically moved by rotating the ball screw 52 with the pulse motor 51. A rectangular second rest table 56, which is swung in the $\theta_1$ direction upon reception of the driving force of the rotary driving mechanism 55, is connected to the distal end portion of the first rest table 54. The swing angle of the second rest table 56 is detected by a swing angle sensor $S_\theta$ provided to the lower end of the ball screw 52. Slits 57 are formed in the second rest table 56 in the widthwise direction. A fork holding member 58 is coupled to the second rest table 56 to be movable along the slits 57 in horizontal direction. The fork holding member 58 has a plurality (five in this embodiment) of forks 59 and a sensor arm 59A above the forks 59. The forks 59 place the wafers W thereon, move forward and backward, and transfer the wafers W between the wafer boat 21 and the carrier stocker 17. As noted above, the forks 59 is constructed to be movable in directions of forward and backward, horizontally and vertically, and to be swing within a horizontal plane. First and second sensors $S_A$ and $S_B$ are mounted on the sensor arm 59A. The first sensor $S_A$ is mounted on the upper surface of the distal end portion of the sensor arm 59A. As shown in FIG. 6A, when the sensor arm 59A is moved in the direction of an arrow with respect to the wafer w, it detects the central positions (positions of through holes H) and circumferential positions of position detecting plates $T_1$ and $T_2$. The second sensor $S_B$ is mounted on the end face of the distal end portion of the sensor arm 59B. As shown in FIG. 6B, when the sensor arm 59B is vertically moved, it detects the levels of the position detecting plates $T_1$ and $T_2$. Each of the first and second sensors $S_A$ and $S_B$ can be constituted by an optical reflection type sensor, but is not limited to this.

The pulse motor 51, the rotary driving mechanism 55, and the fork holding member 58 are connected to a controller 60, and their movements are controlled by the controller 60. The first and second sensors $S_A$ and $S_B$ are also connected to the controller 60. The controller 60 is connected to a memory 61. Position information from the pulse motor 51, the rotary driving mechanism 55, and the fork holding member 58 are written in the memory 61, and read out from the memory 61 as required and sent to the controller 60.

Figure 7:
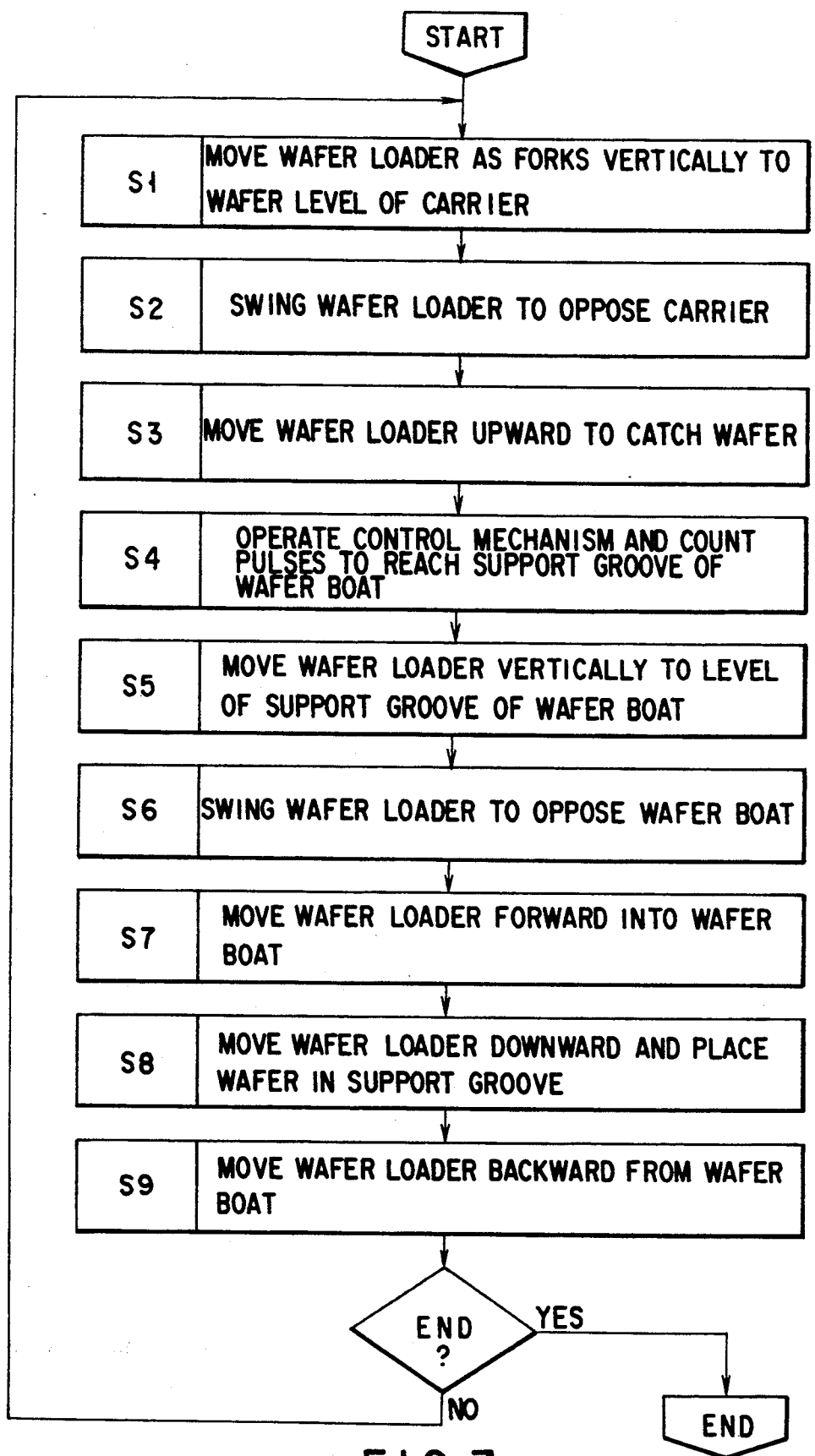
FIG. 7 is a flow chart for explaining the basic operation of the transfer unit.

The basic operation of the transfer unit 20 with respect to the wafer boat 21 is as shown in FIG. 7. More specifically, $S_1$: move the forks 59 of the transfer unit 20 vertically by the pulse motor 51 to cause them to oppose the position of at least one wafer w in the carrier C on the transfer stage 15 which is to be transferred;

$S_2$: swing the fork holding member 58 toward the carrier C and move the forks 59 forward to be inserted under the wafers W;

$S_3$: move the forks 59 slightly upward to place the wafers W thereon and move the forks 59 backward;

$S_4$: calculate the distances between the reference position of the wafer boat 21 and the positions of the support grooves to which the wafers W are to be transferred. These distances are represented by, e.g., the pulse counts of the pulse motor 51 that vertically moves the forks 59 of the transfer unit 20;

$S_5$: move the forks 59 vertically by a distance corresponding to the pulse count calculated by the pulse motor 51;

$S_6$: swing the forks 59 to oppose the wafer boat 21;

$S_7$: move the forks 59 forward horizontally in the direction of an arrow in FIG. 4 so that the four points on the peripheral portions of the wafers W are inserted in the grooves 41A of each pole 41;

$S_8$: move the forks 59 slightly downward so that the wafers W are supported by the poles 41; and $S_9$: move the forks 59 backward from the wafer boat 21.

Then, the operations of the above steps $S_1$ to $S_9$ are repeated to transfer a desired number of wafers W. Usually, the wafers W are transferred starting from the ones to be transferred to the upper support grooves 41A of the wafer boat 21.

Figure 8:
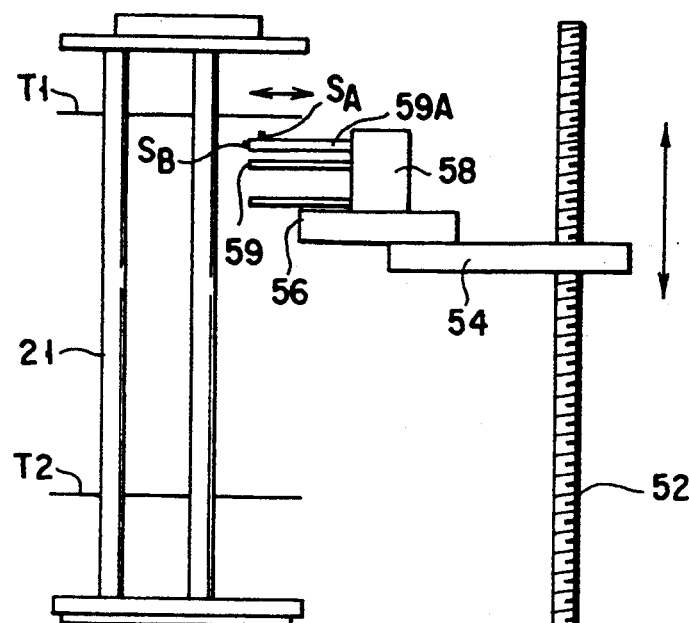
FIG. 8 is a front view showing the positional relationship between a wafer boat and the transfer unit.
Figure 9:
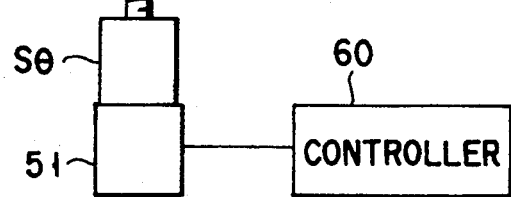
FIG. 9 is a plan view of FIG. 8.
Figure 9:
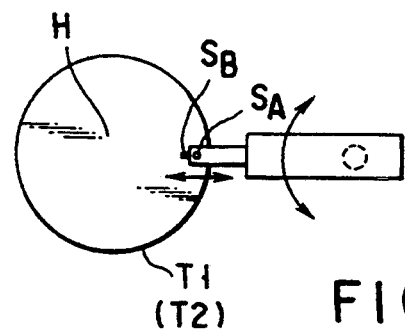

In the present invention, as shown in FIG. 8, the position detecting plates $T_1$ and $T_2$ are inserted in the grooves 41A at the uppermost and lowermost levels, respectively, of the wafer boat 21, and are supported at appropriate states. This operation is manually performed. The position detecting plates $T_1$ and $T_2$ are round disks which are made of, e.g., silicon, and which have diameters almost equal to that of the actual wafer W, as shown in FIG. 9, and the small through holes H at the center.

The positions of the position detecting plates $T_1$ and $T_2$ are detected by the first and second sensors $S_A$ and $S_B$ in the following manner.

Figure 10A:
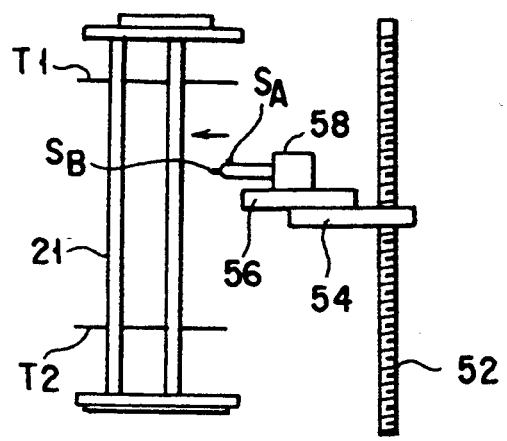
FIGS. 10A to 10F are views for explaining position detection of position detecting plates $T_1$ and $T_2$ by the first and second sensors $S_A$ and $S_B$.

As shown in FIG. 10A, the first rest table 54 is moved to an appropriate position between the two position detecting plates $T_1$ and $T_2$ by the ball screw 52. At this position, the sensor arm 59A is moved forward toward the wafer boat 21 such that the distal end portion of the sensor arm 59A is located between the position detecting plates $T_1$ and $T_2$. At this time, the position of the sensor arm 59A is arbitrary as far as it is between the position detecting plates $T_1$ and $T_2$. The distal end portion of the sensor arm 59A is preferably at a forward position inward the circumference of the position detecting plates $T_1$ and $T_2$ by e.g., about ¼ the diameter.

Figure 10B:
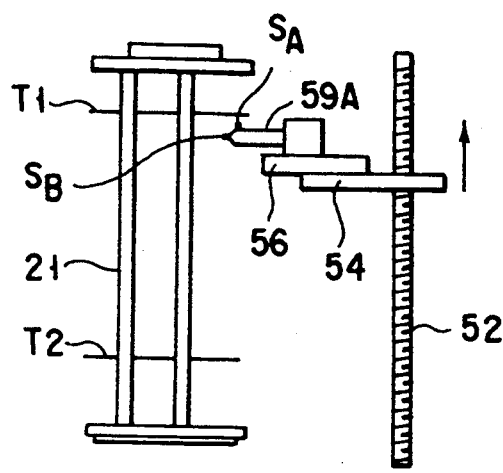
Figure 10C:
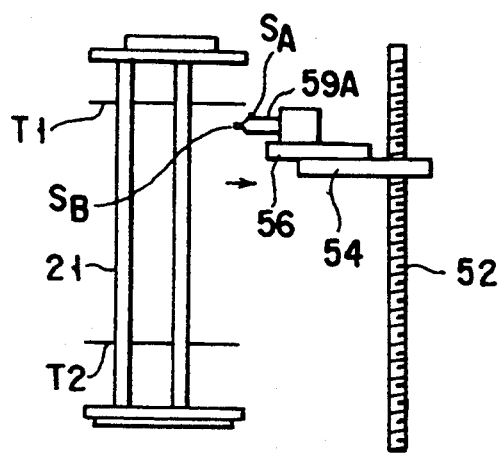
Figure 10D:
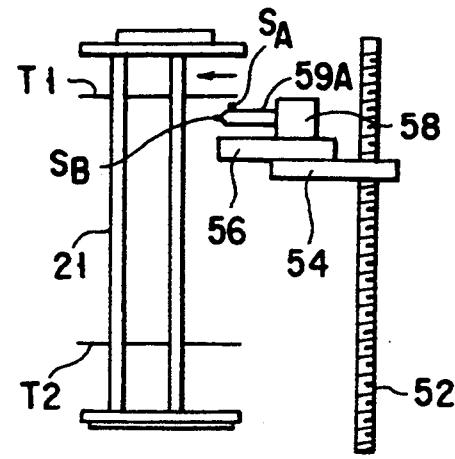

As shown in FIG. 10B, the first rest table 54 is moved upward until the first sensor $S_A$ detects the upper position detecting plate $T_1$, so that the distal end portion of the first rest table 54 is close to the lower surface of the position detecting plate $T_1$. Subsequently, as shown in FIG. 10C, the sensor arm 59A is moved backward until its distal end portion is located at the circumference of the position detecting plate $T_1$. At this time, the circumferential position of the position detecting plate $T_1$ is detected by the first sensor $S_A$. Based on the value of the forward-movement distance of the sensor arm 59A, information $a_1$ on the circumferential position is calculated as a distance obtained with reference to, e.g., the ball screw 52 as the reference origin, sent to the controller 60 as an encoded value of, e.g., the sensor arm 59A, and stored in the memory 61.

Figure 11:
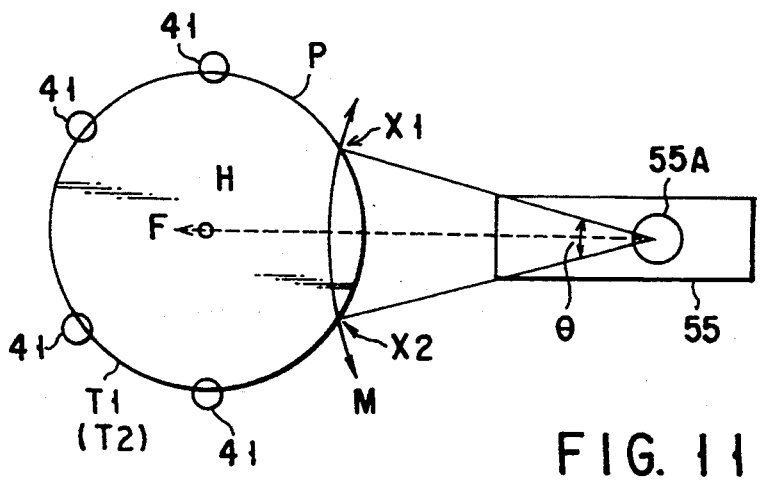
FIG. 11 is a plan view for explaining the principle of detecting swing angle information in the method of the present invention.

Then, as shown in FIG. 11, the second rest table 56 is swung within a horizontal plane about the driving shaft 55A of the rotary driving mechanism 55 as the center, so that the first sensor $S_A$ is swung along an arc M intersecting a circumferential edge P of the position detecting plate $T_1$, thereby detecting intersecting points $X_1$ and $X_2$ of the circumferential edge P and the arc M. Swing angle $\theta$ information obtained at this time is detected by the swing angle sensor $S_\theta$, and this information is sent to the controller 60 as an encoded value and stored in the memory 61. Simultaneously, a forward-movement direction F corresponding to $\theta/2$ is determined from the swing angle information, and forward-movement direction information $b_1$ is stored in the memory 61 through the controller 60.

Figure 10E:
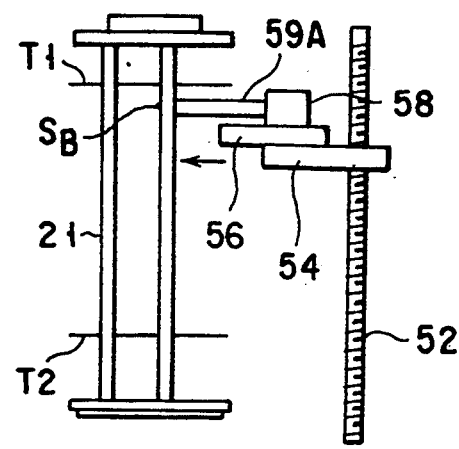

As shown in FIG. 10E, the sensor arm 59A is moved forward in the forward-movement direction F until the through hole H of the position detecting plate $T_1$ is detected by the first sensor $S_A$. Forward-movement distance information $c_1$ obtained at this time is stored in the memory 61 through the controller 60.

Figure 10F:
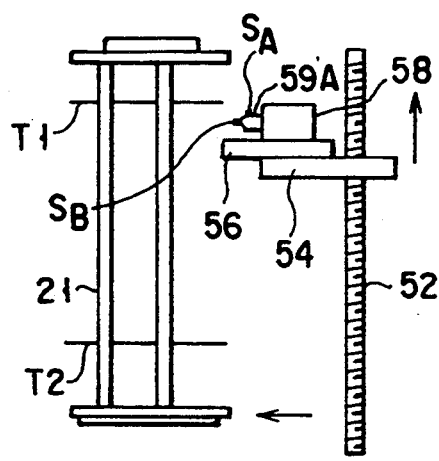

Subsequently, as shown in FIG. 10F, the sensor arm 59A is moved backward until it is located at a regulated position outside the circumference of the position detecting plate $T_1$, and is moved upward. Then, the peripheral surface of the position detecting plate $T_1$ is detected by the second sensor $S_B$. Information $d_1$ on the level of the position detecting plate $T_1$ is sent to the controller 60 to be calculated as a pulse count of the pulse motor 51, and stored in the memory 61.

Then, the sensor arm 59A is moved downward, and the position detecting operation identical to that described above is executed regarding the lower position detecting plate $T_2$. Hence, circumferential position information $a_2$, forward-movement direction information $b_2$, forward-movement distance information $c_2$, and level information $d_2$ of the lower position detecting plate $T_2$ are stored in the memory 61.

By the above operation, the circumferential position information, the forward-movement direction information, the forward-movement distance information, and the level information of the upper and lower position detecting plates $T_1$ and $T_2$ that are appropriately arranged in the installed wafer boat 21 are obtained. Calculation is performed based on these pieces of information stored in the memory 61, and the positions of the respective grooves 41A of the wafer boat 21 are specified. The position of the wafer boat 21 is controlled by the controller 60 on the basis of the position information of the respective grooves 41A, so that the operations of the forks 59 of the wafer boat 21 with respect to the wafer boat 21 are performed very accurately.

Since the levels of the respective grooves 41A between the position detecting plates $T_1$ and $T_2$ can be calculated by using the level information $d_1$ and the level information $d_2$, control for the levels of the forks 59 with respect to the respective grooves 41A can be appropriately performed. More specifically, a difference ($n_1 - n_2$) between a pulse count $n_1$ of the pulse motor 51, corresponding to a distance between the reference position and the upper position detecting plate $T_1$ obtained from the level information $d_1$, and a pulse count $n_2$ of the pulse motor 51, corresponding to a distance between the reference position and the lower position detecting plate $T_2$ obtained from the level information $d_2$, is divided by the known number m of grooves between the position detecting plates $T_1$ and $T_2$ of the wafer boat 21, and the obtained quotient $(n_1-n_2)/m$ is the actual groove pitch. This value is very close to the state of the actual wafer boat 21 and thus has high reliability.

Furthermore, information on the appropriate swing angles and information on the distances through which the forks 59 must move forward until the forward-movement directions F at the respective levels are reached are calculated from the circumferential position information $a_1$ and the circumferential position information $a_2$, the forward-movement direction information $b_1$ and the forward-movement direction information $b_2$, and the forward-movement distance information $c_1$ and the forward-movement distance information $c_2$. In this operation, since the diameters of the position detecting plates $T_1$ and $T_2$ are known, if the pieces of information on these diameters are stored in the memory 61 in advance, the distance through which the forks 59 must move forward can be calculated on the basis of the circumferential position information. Therefore, although it is not theoretically unnecessary to detect the through hole H at the center of each position detecting plate, when the centers of the position detecting plates are detected in this manner, position information having a higher precision can be obtained.

The position of the transfer unit 20 is controlled in the manner as described above. More specifically, when a wafer boat 21 is newly installed, the vertical directions, horizontal directions, and forward-movement distances regarding all the grooves 41A of the wafer boat 21 can be calculated with respect to this reference origin in the transfer unit 20. Therefore, when the first and second rest tables 54 and 56 and the forks 59 of the transfer unit 20 are driven based on these pieces of information, the wafers W can be appropriately transferred to all the grooves 41A of the wafer boat 21.

As described above, when the two position detecting plates $T_1$ and $T_2$ are used, and the pieces of position information on the plates $T_1$ and $T_2$ are used, even if the wafer boat 21 is inclined with respect to the vertical direction or is twisted, information on the inclination or torsion can be obtained. Therefore, the transfer unit 20 can be controlled very precisely without preventing from bringing the wafers W into contact with the wafer boat 21, which is very preferable. In this case, it is preferable to arrange the two position detecting plates in two support grooves that are most separated from each other in the wafer boat. Then, further precise position information can be obtained.

Although two position detecting plates are used in this embodiment, only one position detecting plate may be used. More specifically, the position information of one position detecting plate is obtained, and position information regarding the specific support groove in which this position detecting plate is arranged is obtained. Simple calculation is performed by using these pieces of position information and information on the known number of the support grooves and the basic groove pitch of the wafer boat, the circumferential position information, the forward-movement direction information, the forward-movement distance information, and the level information of this position detecting plate. Hence, position information necessary for position control of the transfer unit can be obtained. In this case, the position of the support groove in the wafer boat in which the position detecting plate is to be arranged is not particularly limited, and the position detecting plate can be arranged either at the upper, lower, or central position of the wafer boat. When the transfer unit is controlled every transfer operation of the forks based on the circumferential position information, the forward-movement direction information, the forward-movement distance information, and the level information, more accurate transfer can be performed. The number of position detecting plates can be three or more.

In the present invention, the practical principle and means for obtaining the circumferential position information, the forward-movement direction information, the forward-movement distance information, and the level information of the position detecting plate are not particularly limited, and various methods can be utilized for this purpose. More specifically, a mark, a deformed portion, or the like may be formed as an information source in the circumferential edge and/or the central position of the position detecting plate, and these pieces of information may be detected from this information source by a sensor.

This embodiment exemplifies a case wherein a wafer boat is used as a substrate support member. However, in the present invention, the substrate support member can be, e.g., a wafer carrier. The purpose of the substrate support member is not limited to a specific one. In the present invention, the arrangement of the transfer unit is not also specifically limited. The transfer unit may have another arrangement to move the first and second rest tables and the fork holding member vertically, horizontally, and forward and backward.

As has been described above, according to the present invention, the position of the transfer unit with respect to a newly installed substrate support member can be automatically and appropriately controlled within a short period of time. Hence, substrate transfer can be performed with very high reliability. Since automatic position control can be achieved only by appropriately arranging the position detecting plates, a cumbersome manual operation is not needed, which is very suitable to control for the position of a transfer unit of a heat treatment apparatus which must be usually controlled within a very narrow range.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of transferring a substrate with a transfer unit comprising at least one fork having a substrate support portion, and a sensor arm having a sensor mounted thereon, for transferring the substrate between a substrate holding member and a substrate support member, comprising the steps of:

arranging a position detecting plate on a rest portion of said substrate support member;

obtaining position information of said position detecting plate by detecting a position of said position detecting plate with respect to a reference position of said transfer unit by said sensor arm; and transferring the substrate by controlling the position of said transfer unit on the basis of the position information;

wherein said sensor arm has first and second sensors mounted thereon, said first sensor detects a circumferential position of said position detecting plate, and said second sensor detects a level position of said position detecting plate.

2. A method according to claim 1, wherein the position information is obtained on the basis of information detected by said first and second sensors.

3. A method according to claim 1, wherein the position information includes circumferential position information, forward-movement direction information, forward-movement distance information, and level information of said position detecting plate.

4. A method according to claim 1, wherein the position of said transfer unit is controlled such that the substrate can be appropriately placed on said rest portion of said substrate support member based on the position information.

5. A method according to claim 4, wherein the position of said transfer unit is determined by swinging and horizontally and vertically moving said transfer unit.

6. A method according to claim 1, wherein said substrate support member is a wafer boat, and the substrate is one selected from the group consisting of a semiconductor wafer and an LCD substrate.

7. A method according to claim 1, wherein the position of said transfer unit is controlled each time said fork of said transfer unit is operated.

8. A method of transferring a substrate with a transfer unit comprising at least one fork having a substrate support portion, and a sensor arm having a sensor mounted thereon, for transferring the substrate between a substrate holding member and a substrate support member, comprising the steps of:

arranging at least two position detecting plates on a rest portion of said substrate support member;

obtaining position information of said position detecting plates by detecting positions of said position detecting plates with respect to a reference position of said transfer unit by said sensor arm;

specifying an installation state of said substrate support member based on the position information of said position detecting plates; and transferring the substrate by controlling the position of said transfer unit on the basis of a specified installation state of said substrate support member;

wherein said sensor arm has first and second sensors mounted thereon, said first sensor detects central positions and circumferential positions of said position detecting plates, and said second sensor detects levels of said position detecting plates.

9. A method according to claim 8, wherein the position information is obtained on the basis of information detected by said first and second sensors.

10. A method according to claim 8, wherein the position information includes circumferential position information, forward-movement direction information, forward-movement distance information, and level information of said position detecting plates.

11. A method according to claim 8, wherein the position of said transfer unit is controlled such that the substrate can be appropriately placed on said rest portion of said substrate support member based on the position information.

12. A method according to claim 11, wherein the position of said transfer unit is determined by swinging and horizontally and vertically moving said transfer unit.

13. A method according to claim 8, wherein said substrate support member is a wafer boat, and the substrate is one selected from the group consisting of a semiconductor wafer and an LCD substrate.

14. A method according to claim 8, wherein the position of said transfer unit is controlled each time said fork of said transfer unit is operated.

* * * * *